(12) United States Patent
Rahman et al.

(10) Patent No.: US 9,627,261 B1
(45) Date of Patent: Apr. 18, 2017

(54) MULTI-CHIP INTEGRATED CIRCUIT

(71) Applicant: Xilinx, Inc., San Jose, CA (US)

(72) Inventors: Arifur Rahman, San Jose, CA (US); Venkatesan Murali, San Jose, CA (US)

(73) Assignee: XILINX, INC., San Jose, CA (US)

( * ) Notice: Subject to any disclaimer, the term of this patent is extended or adjusted under 35 U.S.C. 154(b) by 25 days.

(21) Appl. No.: 14/573,041

(22) Filed: Dec. 17, 2014

Related U.S. Application Data

(62) Division of application No. 12/716,941, filed on Mar. 3, 2010, now abandoned.

(51) Int. Cl.
  *H01L 21/82* (2006.01)
  *H01L 25/00* (2006.01)

(52) U.S. Cl.
  CPC .............. *H01L 21/82* (2013.01); *H01L 25/50* (2013.01)

(58) Field of Classification Search
  CPC .................................................. H01L 2224/80
  See application file for complete search history.

(56) References Cited

U.S. PATENT DOCUMENTS

| | | | |
|---|---|---|---|
| 6,020,633 A | 2/2000 | Erickson | |
| 6,379,998 B1 | 4/2002 | Ohta et al. | |
| 7,518,398 B1 | 4/2009 | Rahman et al. | |
| 7,576,435 B2 | 8/2009 | Chao | |
| 7,589,409 B2 | 9/2009 | Gibson et al. | |
| 7,619,441 B1 | 11/2009 | Rahman et al. | |
| 2003/0015793 A1* | 1/2003 | Merchant | H01L 21/76843 257/734 |
| 2003/0122243 A1* | 7/2003 | Lee | H01L 21/4857 257/700 |
| 2003/0227095 A1 | 12/2003 | Fujisawa et al. | |
| 2004/0063249 A1 | 4/2004 | Lin et al. | |
| 2004/0241958 A1* | 12/2004 | Guarini | H01L 21/6835 438/455 |
| 2006/0197619 A1* | 9/2006 | Oishi | H03B 5/32 331/158 |
| 2007/0037321 A1* | 2/2007 | Higashino | H01L 23/3121 438/109 |
| 2007/0037379 A1 | 2/2007 | Enquist et al. | |
| 2007/0096306 A1 | 5/2007 | Yamagata | |
| 2008/0265383 A1* | 10/2008 | Brunnbauer | H01L 21/561 257/659 |
| 2009/0057885 A1 | 3/2009 | Theuss | |
| 2009/0070727 A1 | 3/2009 | Solomon | |

(Continued)

FOREIGN PATENT DOCUMENTS

| | | |
|---|---|---|
| CN | 1551343 | 12/2004 |
| FR | 2691837 | 12/1993 |

OTHER PUBLICATIONS

Specification and drawings for U.S. Appl. No. 12/716,941, filed Mar. 3, 2010, Rahman et al.

*Primary Examiner* — Thao X Le
*Assistant Examiner* — Geoffrey Ida
(74) *Attorney, Agent, or Firm* — LeRoy D. Maunu

(57) ABSTRACT

An integrated circuit (IC) combines a first IC chip (die) having a first on-chip interconnect structure and a second IC chip having a second on-chip interconnect structure on a reconstructed wafer base. The second IC chip is edge-bonded to the first IC chip with oxide-to-oxide edge bonding. A chip-to-chip interconnect structure electrically couples the first IC chip and the second IC chip.

15 Claims, 4 Drawing Sheets

(56) References Cited

U.S. PATENT DOCUMENTS

2009/0108440 A1 4/2009 Meyer et al.
2009/0140421 A1 6/2009 Lin et al.
2009/0267238 A1 10/2009 Joseph et al.
2010/0006988 A1 1/2010 Tang et al.

\* cited by examiner

MULTI-CHIP INTEGRATED CIRCUIT

CROSS-REFERENCE TO RELATED APPLICATIONS

This application is a divisional of U.S. patent application Ser. No. 12/716,941 filed on Mar. 3, 2010, which is hereby incorporated herein by reference.

TECHNICAL FIELD

This invention relates generally to integrated circuits, and more particularly to fabrication of a large integrated circuit from multiple dice.

BACKGROUND

For a given node technology, increasing integrated circuit (IC) size typically increases the functionality that can be included on a chip. Unfortunately, defects often scale with chip area. A large chip is more likely to incorporate a defect than is a smaller chip. Defects affect yield, and yield loss often increases with increasing chip size. Various techniques have been developed to provide large ICs at desirable yield levels.

One approach to providing large ICs is to construct a large IC out of multiple smaller ICs (dice) on a silicon interposer. The silicon interposer is essentially a substrate to which the dice are flip-chip bonded after the silicon interposer has been processed to provide metal wiring and contacts. For example, a silicon wafer is fabricated to form one or more silicon interposers with several patterned metal layers and intervening insulating layers connected to vias, as is commonly called "back-end processing". Conventional conductive vias through the insulating layers connect the patterned metal layers together, and the dice are physically and electrically connected to the interposer with micro-bump arrays.

These patterned metal layers provide a high density interconnect pattern to the IC dice. The silicon interposer connects the fine-pitched dice to a coarser bump array on the opposite side of the interposer, and provides interconnects between dice. Conductive through-silicon vias (TSVs) extend through the silicon interposer to electrically connect the dice to a bump array on the opposite side of the silicon interposer. This bump array is used to electrically and mechanically connect the large IC to a patterned circuit board or packaging substrate.

Unfortunately, conductive TSVs are relatively expensive to fabricate and some techniques for TSVs, such as plated TSVs, introduce significant processing delays. For example, the use of through-plated TSVs may add two to three hours to the process flow of the large IC.

Providing large ICs that avoid the disadvantages of the prior art are desirable.

SUMMARY

An integrated circuit (IC) has a first IC chip (die) having a first on-chip interconnect structure mounted on a reconstructed wafer base and a second IC chip having a second on-chip interconnect structure mounted on the reconstructed wafer base. The second IC chip is edge-bonded to the first IC chip with oxide-to-oxide edge bonding. A chip-to-chip interconnect structure disposed on the first IC chip and on the second IC chip electrically couples the first on-chip interconnect structure to the second on-chip interconnect structure. In a further embodiment, the IC has a contact array on the chip-to-chip interconnect structure, such as a ball grid array or a bump array. In a particular embodiment, the reconstructed wafer base comprises molding compound. In a particular embodiment, the oxide-to-oxide edge bonding comprises silicon dioxide.

In a further embodiment, the IC includes a third IC chip having a third on-chip interconnect structure mounted on the reconstructed wafer base, the third on-chip interconnect structure being coupled to at least one of the first on-chip interconnect structure or the second on-chip interconnect structure through the chip-to-chip interconnect structure.

In a particular embodiment, the chip-to-chip interconnect structure includes a first patterned metal layer, a first dielectric layer between the first on-chip interconnect structure and the second on-chip interconnect structure and the first patterned metal layer, a second patterned metal layer, and a second dielectric layer between the first patterned metal layer and the second patterned metal layer. In a further embodiment, a first conductive via extends from the first patterned metal layer through the first dielectric layer to the first on-chip interconnect structure and a second conductive via extends from the second patterned metal layer through the second dielectric layer to the first patterned metal layer.

In another embodiment, a composite IC is fabricated by producing IC dice, each IC die having an on-chip interconnect structure. Edges of the IC dice are polished, and an oxide layer is deposited to coat the edges of the IC dice to form an edge oxide layer. In some embodiments, edges of the dice that will become the perimeter edge of the composite IC are not polished.

The edge oxide layer is activated, such as by treating with an ammonia solution or oxygen plasma, and the IC dice are arranged on an edge-bonding carrier in one or more composite IC patterns. The IC dice are edge bonded together, e.g., using a low-temperature bonding process, which in a particular process includes heating the IC dice to a temperature not greater than 250 degree Celsius. Force is optionally applied during the edge bonding process to hold the IC dice in contact with each other.

A reconstructed wafer base is formed on the IC dice to form a reconstructed wafer. In a particular embodiment, the reconstructed wafer base is made of moulding compound. A chip-to-chip interconnect structure on the reconstructed wafer electrically couples the on-chip interconnect structures. If the reconstructed wafer has more than one composite IC, the composite ICs are singulated from the reconstructed wafer.

In a particular embodiment, the oxide layer comprises deposited silicon dioxide and is deposited at a temperature not greater than 450 degrees Celsius. In a particular embodiment, fabricating the chip-to-chip interconnect structure includes forming at least two patterned metal layers with an intervening dielectric layer on the reconstructed wafer. In a particular embodiment, the intervening dielectric layer comprises a deposited silicon dioxide layer and a first of the two patterned metal layers comprises a damascene or dual damascene patterned metal layer.

In a further embodiment, after fabricating the chip-to-chip interconnect structure but before singulating the composite ICs, a first contact array (e.g., a ball grid array or a solder bump array) is formed on a first composite IC of the reconstructed wafer, and a second contact array is formed on a second composite IC of the reconstructed wafer. In some embodiments, the composite ICs on a reconstructed wafer are all the same type (pattern). Alternatively, the IC dice are arranged in different patterns to produce different types of composite ICs. For example, a first plurality of IC dice are arranged in a first composite IC pattern and a second plurality of IC dice are arranged in a second composite IC pattern different from the first composite pattern.

DETAILED DESCRIPTION

Figure 1:
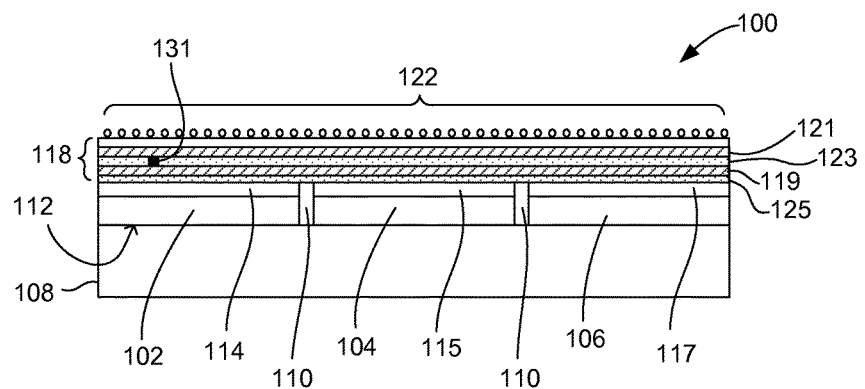
FIG. 1 is a cross section of an IC according to an embodiment.

FIG. 1 is a cross section of an IC 100 according to an embodiment. The IC includes multiple chips (dice) 102, 104, 106 edge-bonded to each other and mounted on a reconstructed wafer base 108, such as a silicon wafer or molding compound. The carrier is a polycrystalline or single-crystal silicon carrier in some embodiments. Alternatively, the carrier is formed from molding compound. In a particular embodiment, silicon particles or other particles are incorporated in molding compound to improve thermal expansion matching or heat conductivity.

The dice 102, 104, 106 are ICs such as field-programmable gate arrays (FPGAs), processors, application-specific ICs (ASICs), or memory chips (e.g., RAM). The dice may be of the same type (e.g., all FPGA chips), or different types (e.g., some FPGAs and some RAM chips). The dice are ICs that are smaller than the IC 100, and will be referred to as dice so that these physical chips are distinguished from the larger IC 100 in the subsequent description. The dice 102, 104, 106 have been tested and sorted to ensure that defective dice are not being used in the IC 100, and are edge-bonded together with oxide-to-oxide bonding 110. The thickness of the oxide-to-oxide bonding 110 is exaggerated for purposes of illustration.

For purposes of convenient discussion, the topside of the dice 102, 104, 106 and of the IC 100 will refer to the major processing surface (i.e., the surface on which patterned metal interconnect layers and intervening dielectric layers are formed in what is commonly called the backend IC fabrication sequence, also referred to as the face). The bottom side of the dice and IC will refer to the back side of the silicon wafer on which the dice circuits are formed. For example, the bottom side 112 of die 102 is attached to the reconstructed wafer base 108. An on-chip interconnect structure 114 of die 102 has been formed on the topside of the die 102 using a series of patterned metal layers, intervening dielectric layers, and conductive vias, as is commonly known in the art of IC chip fabrication. For example, an FPGA die might have eleven patterned metal layers, which are commonly described by their order in sequence from the substrate of the silicon chip (e.g., M1, M2, . . . , M11). On-chip interconnect structures 115, 117 have also been formed on the topsides of the other dice 104, 106.

A chip-to-chip interconnect structure 118 is formed on the composite IC after the dice 102, 104, 106 have been edge bonded and secured to the reconstructed wafer base 108. The chip-to-chip interconnect structure 118 includes a second series of patterned metal layers 119, 121, intervening dielectric layers 123, 125, and vias 131. The patterned metal layers 119, 121 are shown as solid layers for clarity of illustration. In a particular embodiment, the patterned metal layers are formed using damascene or dual damascene, or other technique, many of which are known to those of skill in the art of backend wafer processing. In a particular embodiment, the chip-to-chip interconnect structure includes four patterned metal layers (e.g., M12-M14) with intervening dielectric layers. The chip-to-chip interconnect structure 118 interfaces with a ball or bump array 122 that provides electrical connections to the dice 102, 104, 106 of the IC 100. For example, the IC 100 may be flip-chip bonded to a printed wiring board or to a package substrate or carrier (not shown).

In an exemplary embodiment, silicon dioxide is deposited onto the polished edges of dice using a low-temperature (below 450 degrees Celsius, and alternatively below about 400 degrees Celsius) deposition technique, such as a chemical-vapor deposition technique. Using a low-temperature deposition technique allows processing the dice without damaging the intra-chip metal layers. Several silicon dioxide processes are known that form a conformal layer of silicon dioxide, basically blanketing the dice with a layer of silicon dioxide. A typical silicon dioxide layer thickness suitable for an embodiment is on the order of several microns. Wire widths in upper metal layers (e.g., in the M11 to M14 patterned metal layers) are typically on a pitch of a few microns.

Figure 2:
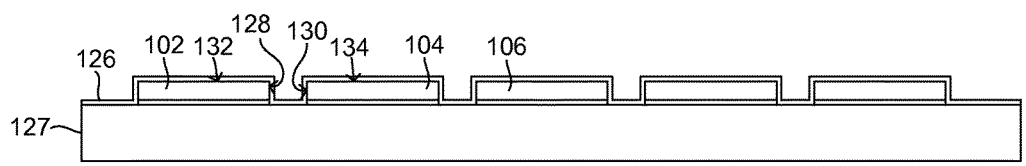
FIG. 2 is a side view of dice with a deposited oxide layer in a step of manufacturing an IC according to an embodiment.

FIG. 2 is a side view of dice 102, 104, 106 with a deposited oxide layer 126 in a step of manufacturing an IC according to an embodiment. The oxide layer 126 is a layer of silicon dioxide typically between about 1 micron to about 3 microns thick. The dice are placed topside down on a deposition processing carrier 127 with sufficient spacing between the dice to allow the deposited oxide to coat the edges 128, 130 of the dice.

The dice 102, 104, 106 are fabricated on one or more semiconductor substrates (wafers, not shown) and singularized by sawing or other technique. The edges of the individual dice are optionally polished after singularization to improve the quality of the die edge for subsequent oxide deposition and edge bonding. Singulation may produce die edges with chips or overhangs, and polishing can improve the surface smoothness and verticality of the die edge. After depositing the oxide layer 126 on the backsides 132, 134 and edges 128, 130 of the dice 102, 104, the oxide layer is optionally activated using an ammonium-based solution or other suitable technique to facilitate low-temperature oxide-to-oxide bonding, such as plasma activation or a micro-scrubbing technique. In a further embodiment, the deposited oxide layer is removed from the backsides of the dice. Suitable techniques for removing this backside oxide include isotropic plasma etch techniques, for example. Removing the backside oxide reduces chip bowing and can improve thermal coupling of the die in the composite IC.

Figure 3:
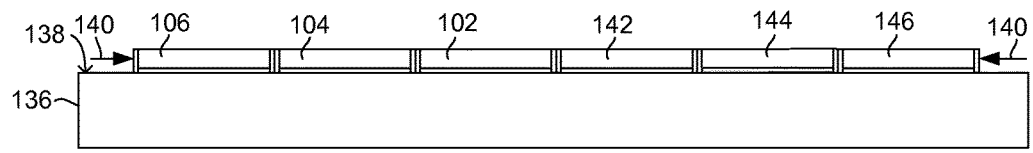
FIG. 3 is a side view of the dice on an edge-bonding carrier.

FIG. 3 is a side view of the dice 102, 104, 106, 142, 144, 146 on an edge-bonding carrier 136. The dice 102, 104, 106, 142, 144, 146 are placed topside (face) down on a bonding processing surface 138 in contact with each other. Force, represented by arrows 140, is optionally applied to hold the dice together as the dice are heated for low-temperature oxide-to-oxide bonding between the oxide-coated edges of the dice. In an exemplary embodiment, additional dice extend away from the viewer to form a tiled surface array of dice (see, e.g., FIG. 6). Force in the planar orthogonal direction (not shown) is also optionally applied to hold the dice together in a grid fashion. In one embodiment, oxide-to-oxide bonding between chemically activated (i.e., ammonium solution treated) chemical vapor deposited silicon dioxide is done at a temperature between about 150 degrees Celsius and about 200 degrees Celsius, which is well below the desired maximum temperature limit of about 400 degrees Celsius to about 450 degrees Celsius.

Figure 4:
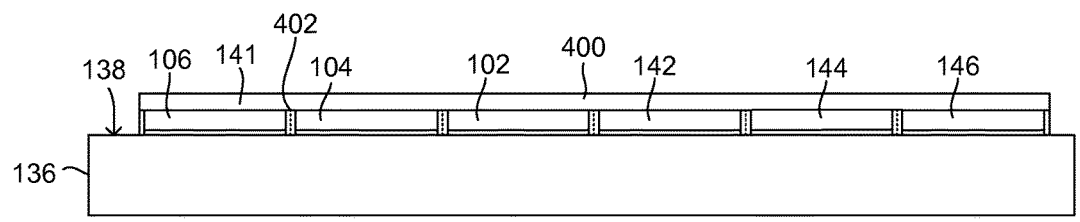
FIG. 4 is a side view of the edge-bonded dice of FIG. 3 with a reconstructed wafer base.

FIG. 4 is a side view of the edge-bonded dice of FIG. 3 with a reconstructed wafer base 400. In a particular embodiment, molding compound or other material formed over the bonded dice to form the reconstructed wafer base 400. The topsides of the dice are co-planar on the processing surface 138. The molding compound forms a reconstructed wafer that will be removed from the carrier 136 and singulated into multiple composite ICs. The deposited oxide layer on the chip edges has been bonded together, as represented by the dotted line 402. The oxide-oxide edge bonding provides a gap-free margin between dice in the composite IC, which in turn provides a smooth transition between dice for metal lines in the chip-to-chip interconnect structure.

Figure 5:
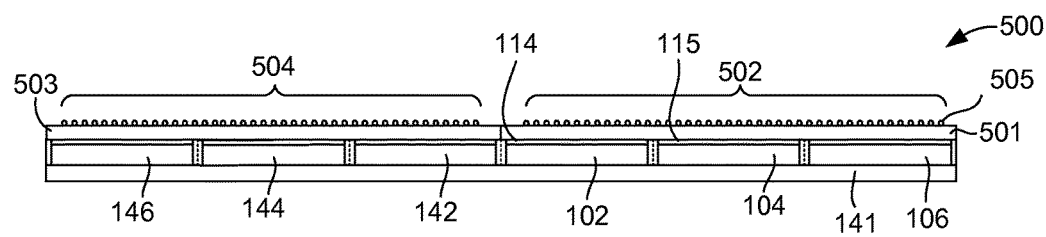
FIG. 5 is a side view of a reconstructed wafer with chip-to-chip interconnect structures for multiple composite ICs.

FIG. 5 is a side view of a reconstructed wafer 500 with chip-to-chip interconnect structures 501, 503 for multiple composite ICs. The chip-to-chip interconnect structures are, for example, additional patterned metal layers with intervening dielectric layers formed over the reconstructed wafer to electrically couple contacts on the on-chip interconnect structure 114 of one chip 102 to the on-chip interconnect structure 115 of another chip 104. Contact arrays 502, 504 of balls or bumps 505 (commonly called "solder balls" or "solder bumps") are formed on the chip-to-chip interconnect structures 501, 503 of what will eventually become composite ICs. In a particular embodiment, the chip-to-chip interconnect structure 501 translates a relatively fine pitch of contacts on the on-chip interconnect structures 114, 115 to a relatively coarse pitch of balls or bumps in the contact array 502. After bumping the reconstructed wafer, composite ICs are singulated from the reconstructed wafer. The composite ICs are further processed or assembled according to the desired application.

Figure 6:
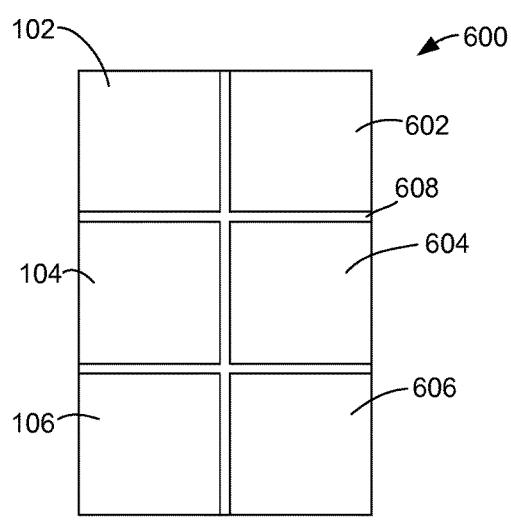
FIG. 6 is a plan view of a composite IC according to an embodiment.

FIG. 6 is a plan view of a composite IC 600 according to an embodiment. The composite IC 600 is shown without the chip-to-chip interconnect structure or ball grid array for purposes of illustration. Dice 102, 104, 106, 602, 604, 606 are edge bonded together with oxide-to-oxide bonding 608. The number of dice is merely exemplary. Alternative composite ICs have more or fewer dice. In alternative embodiments, not all the dice on a composite IC are the same size. The dice are the all the same type of IC chips (e.g., six FPGAs), or alternatively different types of IC chips (e.g., one or more FPGAs, a digital signal processor, or a memory chip).

Figure 7:
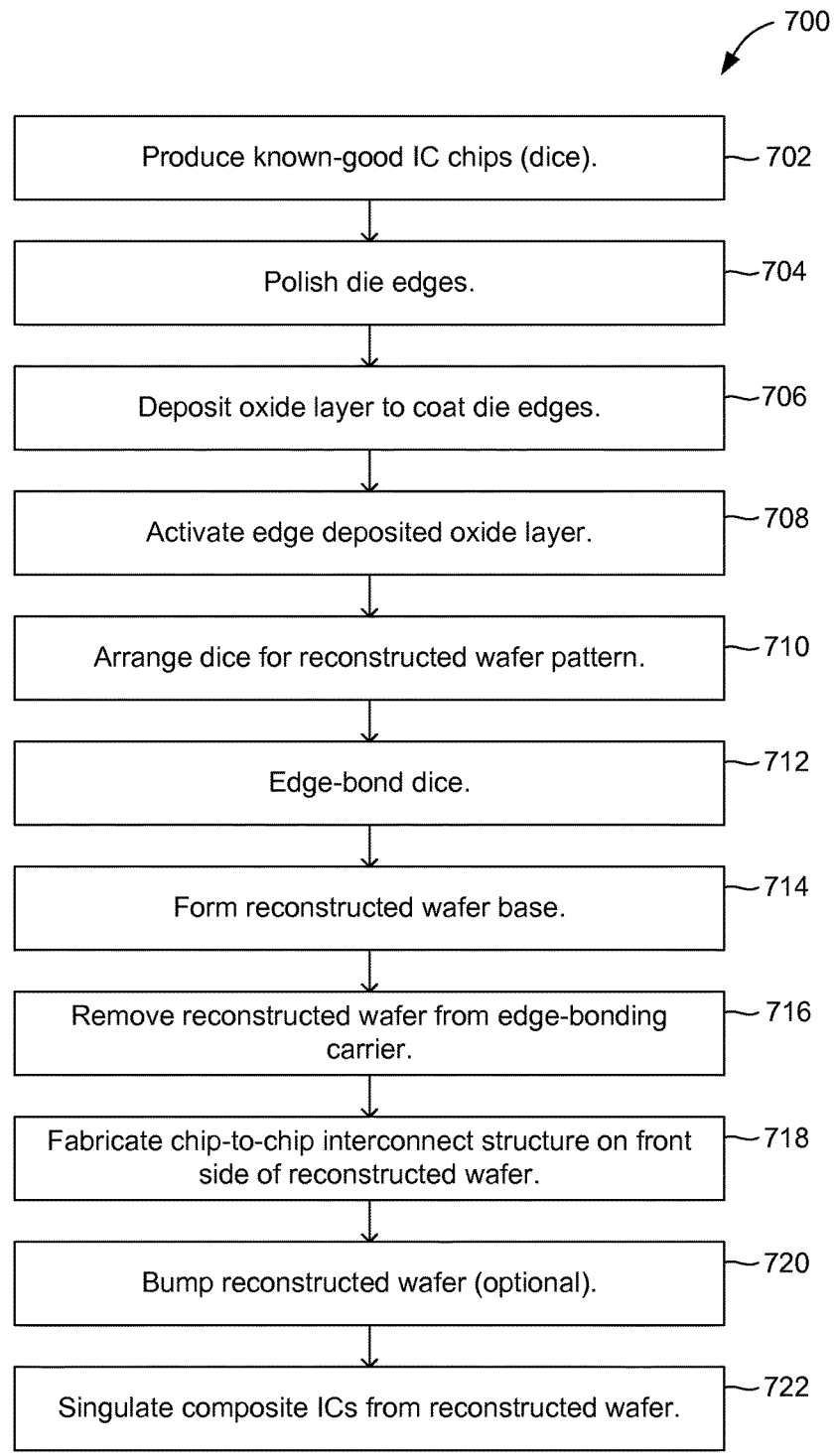
FIG. 7 is a flow chart of a method of fabricating an integrated circuit according to an embodiment.

FIG. 7 is a flow chart of a method 700 of fabricating an integrated circuit according to an invention. One or more wafers are fabricated, tested, and sorted to produce known-good IC dice (step 702). In some embodiments, the IC dice are all the same type of IC. For example, the dice are all FPGAs. In alternative embodiments, different types of ICs are included in the dice. For example, the dice might include an FPGA and a memory IC (e.g., RAM). In some embodiments, some of the dice are made using a first type of fabrication process (e.g., a silicon CMOS fabrication process), while other dice are made using a different type of fabrication process (e.g., a SiGe-wafer fabrication process, an analog or mixed-signal IC fabrication process, or a memory IC fabrication process, such as a flash memory IC, OTP memory IC, NV memory IC, or ROM). Composite ICs according to embodiments can utilize different types of IC dice wherein various dice are optimized for various parameters. For example, one die might be optimized for SRAM functionality, while another die is optimized for logic functionality.

The edges of the dice are optionally polished (step 704). In a particular embodiment, a conventional post-singulation edge polishing technique is used. The edges of the dice are coated with a deposited oxide layer (step 706). In a particular embodiment, the deposited oxide layer is deposited using a conformal deposition technique that does not exceed about 450 degrees Celsius. In a particular embodiment, the deposited oxide layer is a silicon dioxide between about 1 micron and about 3 microns thick. Thicker oxide layers are alternatively used. It is not necessary that each IC have the same edge oxide thickness. The dice are typically placed face-down on a deposition carrier and the deposited oxide layer is optionally removed from the back side of the dice. The deposited oxide layer coating the edges ("edge oxide") is activated to promote oxide-to-oxide edge bonding (step 708). In a particular embodiment, an ammonium solution technique is used to activate the edge oxide. Dice are arranged faced down contacting each other in a selective pattern or sequence on an edge-bonding carrier according to a composite IC design (step 710). For example, a composite IC might be designed to have a RAM die between two FPGA dice. The dice are arranged on the carrier so that the reconstructed wafer has the desired pattern of dice forming the composite ICs. In some embodiments, several different types of composite ICs are arranged on a single reconstructed wafer. The dice on the edge-bonding carrier are heated to edge-bond the dice together (step 712). Edge bonding uses oxide-to-oxide bonding, which in a particular embodiment occurs at a temperature less than about 250 degrees Celsius. Force is optionally applied during the oxide-to-oxide bonding process to hold the dice in contact with each other.

Molding compound is formed over the backsides of the dice on the edge-bonding carrier to form a reconstructed wafer base (step 714). Molding compounds are well known in the art of semiconductor fabrication and packaging. The reconstructed wafer is removed from the edge-bonding carrier (step 716) and the front side of the reconstructed wafer is processed to add a chip-to-chip interconnect structure (step 718), which in a particular embodiment is a series of patterned metal layers, intervening insulating layers, and conductive vias between the patterned metal layers and the on-chip contacts. In a particular embodiment, the chip-to-chip interconnect structure includes four patterned metal layers. In a particular embodiment, the chip-to-chip interconnect structure is coupled to chips having a contact pitch of about 30 microns to about 50 micron. The top level interconnect pitch of the composite IC is typically about 150 microns to about 200 microns; however, these dimensions are merely exemplary. Typically, not all microbump contacts at the die level are brought out to the top level. For example, a chip may have thousands to tens of thousands chip-to-chip connections, with about five thousand to about ten thousand top level bumps (electrical contacts). Solder balls or bumps are optionally formed on the reconstructed wafer (step 720), and the composite ICs are singulated from the reconstructed wafer (step 722).

Figure 8:
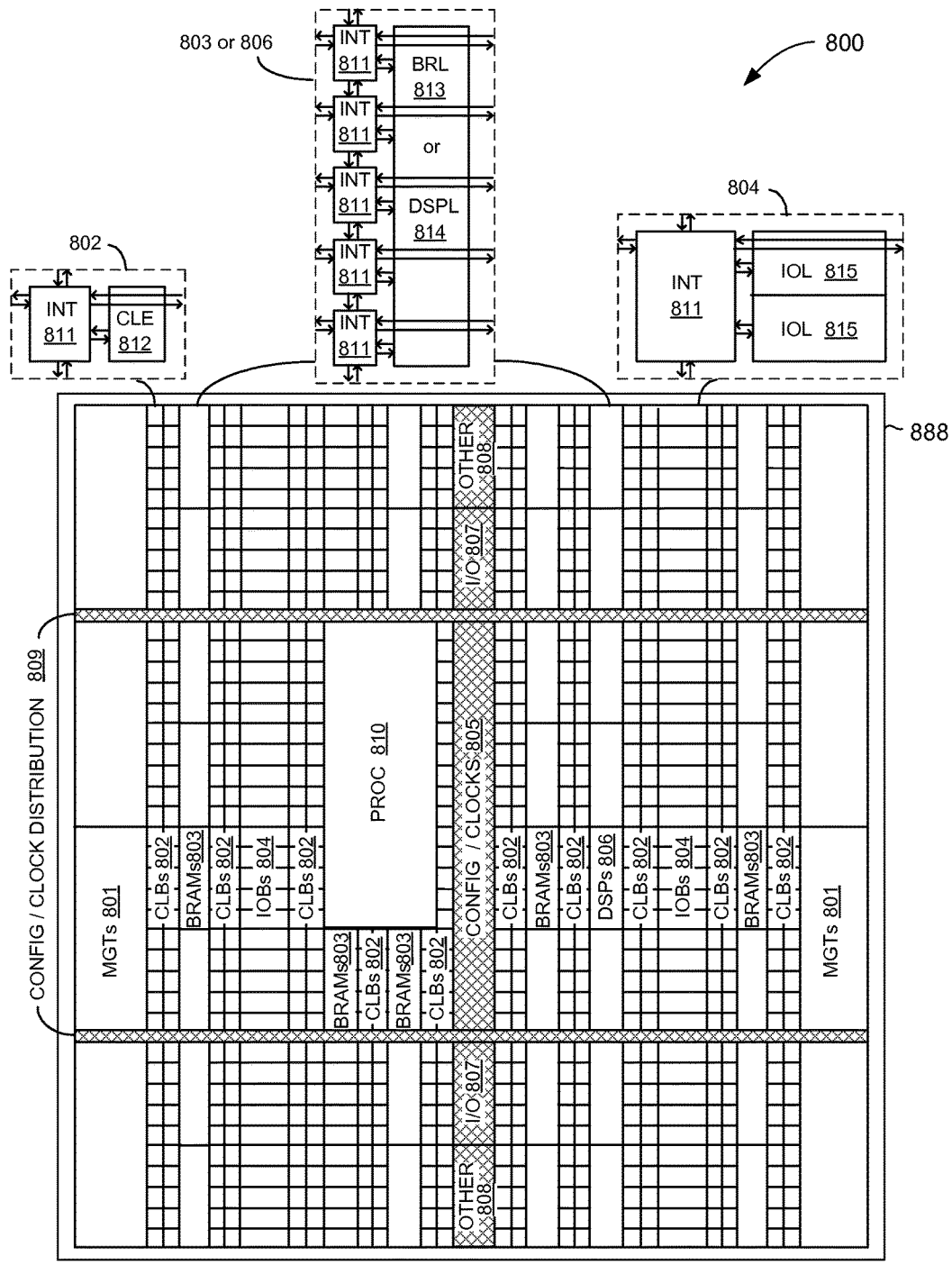
FIG. 8 is a plan view of an IC chip for use in a composite IC according to an embodiment.

FIG. 8 is a plan view of an IC chip 800 for use in a composite IC according to an embodiment. The IC chip is an FPGA with an edge oxide layer 888 used to form oxide-to-oxide edge bonds with one or more other IC chips in an edge-bonded composite IC. Embodiments incorporating FPGAs include composite ICs with different types of FPGAs, such as a high-performance FPGA being joined with a low-cost FPGA, or to optimize different FPGAs within a composite IC for different functionality. For example, one FPGA in the composite IC is optimized for memory performance and another optimized for logic/DRAM design rules. Other embodiments include an FPGA combined with other types of chips, such as a ROM chip, an SRAM chip, or a micro-processor chip. In particular embodiments, composite ICs operate essentially as FPGAs.

The FPGA architecture includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 can include a configurable logic element (CLE 812) that can be programmed to implement user logic plus a single programmable interconnect element (INT 811). A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element (INT 811). A differential I/O buffer 818 is also part of IOB 804. As will be clear to those of skill in the art, the actual I/O pads connected, for example, to the differential I/O buffer 818 are manufactured using metal layers above the various illustrated logic blocks, and typically are not confined to the area of the input/output differential I/O buffer 818. In the pictured embodiment, a columnar area near the center of the die is used for configuration, clock, and other control logic.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative backing materials or combinations of backing materials, such as a silicon wafer in combination with molding compound, are used to form a reconstructed wafer from dice. Therefore, the spirit and scope of the appended claims should not be limited to the foregoing description.

What is claimed is:

1. A method of fabricating a composite integrated circuit ("IC"), the method comprising:
    producing IC dice, each IC die having an on-chip interconnect structure;
    polishing edges of the IC dice;
    depositing an oxide layer to coat the edges of the IC dice to form an edge oxide layer;
    activating the edge oxide layer;
    arranging the IC dice topside down on an edge-bonding carrier in one or more composite IC patterns;
    edge-bonding the IC dice on the edge-bonding carrier, wherein the edge-bonding includes applying force orthogonal to the edges of the IC dice to hold the IC dice in contact with each other;
    forming a reconstructed wafer base on the IC dice to form a reconstructed wafer after the edge-bonding;
    removing the reconstructed wafer and IC dice from the edge-bonding carrier;
    fabricating a chip-to-chip interconnect structure on the topsides of the IC dice to electrically couple the on-chip interconnect structures; and
    singulating one or more composite ICs from the reconstructed wafer.

2. The method of claim 1, wherein the edge-bonding includes heating the IC dice to a temperature not greater than 250 degree Celsius.

3. The method of claim 2, wherein the edge-bonding further includes applying force to hold the IC dice in contact with each other.

4. The method of claim 1, wherein the forming the reconstructed wafer base includes applying molding compound to backsides of edge-bonded dice on the edge-bonding carrier.

5. The method of claim 1, wherein the depositing an oxide layer includes depositing silicon dioxide at a temperature not greater than 450 degrees Celsius.

6. The method of claim 1, wherein the fabricating a chip-to-chip interconnect structure includes forming at least two patterned metal layers with an intervening dielectric layer on the reconstructed wafer.

7. The method of claim 6, wherein:
    the intervening dielectric layer comprises a deposited silicon dioxide layer; and
    a first of the two patterned metal layers comprises a damascene or dual damascene patterned metal layer.

8. The method of claim 1, further comprising, after the fabricating the chip-to-chip interconnect structure and before the singulating,
 forming a first contact array on a first composite IC of the reconstructed wafer; and
 forming a second contact array on a second composite IC of the reconstructed wafer.

9. The method of claim 1, wherein the arranging the IC dice includes arranging a first plurality of IC dice in a first composite IC pattern and arranging a second plurality of IC dice in a second composite IC pattern different from the first composite IC pattern.

10. The method of claim 1, wherein the activating the edge deposited oxide layer includes treating the deposited oxide layer with an ammonium solution.

11. The method of claim 1, further comprising:
 placing the IC dice topside down on a deposition processing carrier before the depositing the oxide layer; and
 removing the IC dice from the deposition processing carrier before placing them in the edge-bonding carrier.

12. The method of claim 1, wherein the depositing the oxide layer is performed after the polishing of the edges and the placing the IC dice.

13. The method of claim 1, further comprising:
 placing the IC dice topside down on a deposition processing carrier before the depositing the oxide layer;
 wherein the depositing the oxide layer coats backsides of the IC dice; and
 removing the oxide layer from the backsides of the IC dice.

14. The method of claim 1, wherein the edge-bonding includes heating the IC dice to a temperature not greater than 250 degree Celsius.

15. The method of claim 1, wherein the forming the reconstructed wafer base includes mounting the IC dice to a silicon wafer.

\* \* \* \* \*